United States Patent [19]

Watanabe

[11] Patent Number: 4,604,495

[45] Date of Patent: Aug. 5, 1986

[54] SEMICONDUCTOR DEVICE AND PROCESS FOR PRODUCING SAME

[75] Inventor: Hisashi Watanabe, Yokohama, Japan

[73] Assignee: Fujitsu Limited, Kawasaki, Japan

[21] Appl. No.: 683,735

[22] Filed: Dec. 19, 1984

[30] Foreign Application Priority Data

Dec. 21, 1983 [JP] Japan .................................. 58-241307

[51] Int. Cl.⁴ ............................................. H01L 23/04
[52] U.S. Cl. .................. 174/52 FP; 29/588; 72/347; 72/353; 72/478; 357/74
[58] Field of Search ............... 174/52 FP; 357/70, 74; 29/588; 72/478, 353, 347, 354, 474, 475, 701

[56] References Cited

U.S. PATENT DOCUMENTS 3,767,839 10/1973 Beal ................................ 174/52 FP

FOREIGN PATENT DOCUMENTS 0076104 6/1983 European Pat. Off. .
57-24554 2/1982 Japan ..................................... 29/588
1484177 1/1977 United Kingdom .

Primary Examiner—Arthur T. Grimley
Assistant Examiner—D. A. Tone
Attorney, Agent, or Firm—Armstrong, Nikaido, Marmelstein & Kubovcik

[57] ABSTRACT

A ceramic-type semiconductor package including a semiconductor pellet, a ceramic lead base having a cavity for accommodating the pellet, and a metal cap for sealing the cavity. The cavity is upward opened, and the metal cap has a central depressed portion to be inserted into the cavity. The central depressed portion has a bottom wall which has a faceted surface.

Also, a process for producing a ceramic-type semiconductor package including the steps of providing a semiconductor pellet, providing a ceramic lead base having an upward opened cavity for accommodating the semiconductor pellet, placing the semiconductor pellet in the cavity of the ceramic lead base, pressing a flat metal plate between a male die and a female die, whereby a metal cap having a central depressed portion is produced, inserting the central depressed portion of the metal cap into the cavity of the ceramic lead base, and sealing the peripheral flat portion of the metal cap with a sealing frame bonded on the ceramic lead base. The male die has a faceted surface. The central depressed portion has a bottom wall which has a faceted surface.

7 Claims, 5 Drawing Figures

SEMICONDUCTOR DEVICE AND PROCESS FOR PRODUCING SAME

BACKGROUND OF THE INVENTION

1. Field of the Invention

The present invention relates to a semiconductor device, more particularly a ceramic-type semiconductor package provided with a metal cap depressed at the central portion thereof, and a process for producing the same.

2. Description of the Related Art

Conventional ceramic-type semiconductor packages generally include as main constituents a semiconductor pellet, a ceramic lead base having a cavity for accommodating the semiconductor pellet, and a metal cap for sealing the cavity. In many cases, the metal cap is given a central depressed portion shaped to correspond to the cavity so as to facilitate alignment.

The metal cap is produced by pressing a flat metal plate between a male die and a female die. The metal cap is seam-welded with a sealing metal frame bonded on a ceramic layer of the ceramic lead base by bringing electrodes into contact at opposite peripheral edge of flat portions of the metal cap. In conventional packages, however, the central depressed portion of the metal cap has a flat bottom surface. Mechanical stress due to the pressing concentrates at the angle portions. As a result, the flat bottom surface of the central depressed portion tends to bend in order to compensate for the residual stress. With such a bent metal cap, the electrodes for the seam weld contact the peripheral flat portions of the metal cap over a broad area, which leads to insufficient generation of heat and thus substandard seam-welding. Furthermore, the flat portion of the metal cap contacts the sealing metal frame on the ceramic layer only at a small area, so that insufficient seam-welding is obtained.

SUMMARY OF THE INVENTION

It is a primary object of the present invention to provide a reliably seam-welded ceramic-type semiconductor package.

It is another object of the present invention to provide a ceramic-type semiconductor package having a metal cap in which residual stress due to pressing is reduced.

One aspect of the present invention is accomplished by a ceramic-type semiconductor package including a semiconductor pellet, a ceramic lead base having a cavity for accommodating the pellet, and a metal cap for sealing the cavity. The cavity is upward opened, and the metal cap has a central depressed portion to be inserted into the cavity. The central depressed portion has a bottom wall which has a faceted surface.

Another aspect of the present invention is accomplished by a process for producing a ceramic-type semiconductor package including the steps of providing a semiconductor pellet, providing a ceramic lead base having an upward opened cavity for accommodating the semiconductor pellet, placing the semiconductor pellet in the cavity of the ceramic lead base, pressing a flat metal plate between a male die and a female die, whereby a metal cap having a central depressed portion is produced, inserting the central depressed portion of the metal cap into the cavity of the ceramic lead base, and sealing the peripheral flat portion of the metal cap with a sealing frame bonded on the ceramic lead base. The male die has a faceted surface. The central depressed portion has a bottom wall which has a faceted surface.

BRIEF DESCRIPTION OF THE DRAWINGS

Other objects and advantages of the present invention will become further apparent from the following description in reference to the drawings, wherein.

DESCRIPTION OF THE PREFERRED EMBODIMENTS

Before describing the preferred embodiments of the present invention, an explanation will be given of the related art for reference purposes.

Figure 1:
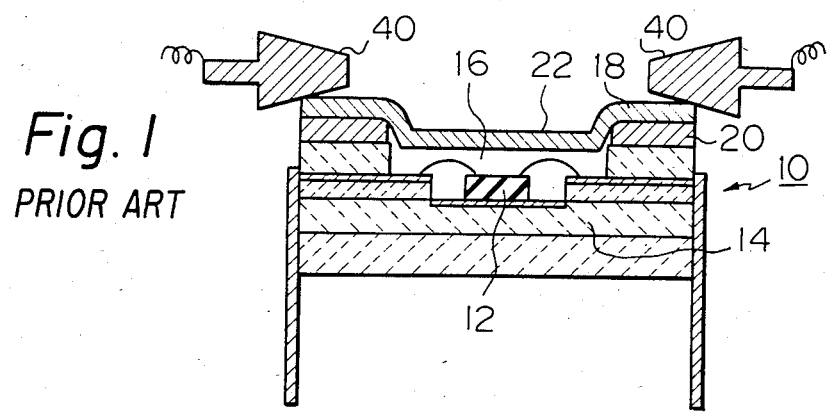
FIG. 1 is a sectional view of a conventional ceramic-type semiconductor package.

FIG. 1 shows a conventional ceramic-type semiconductor package. The semiconductor package 10 includes as main constituents a semiconductor pellet 12, a ceramic lead base 14 having a cavity 16 for accommodating the semiconductor pellet 12, and a metal cap 18 for sealing the cavity 16 via a sealing metal frame 20 bonded on the periphery of the ceramic lead base 14. The metal cap 18 has a central depressed portion 22, which is shaped to correspond to the cavity 16 so as to easily align with the cavity 16. The ceramic lead base 14 includes ceramic layers and metal leads. The metal cap 18 consists of a metal such as 42 nickel-iron alloy or a cobalt-nickel-iron alloy sold under the tradename "Kovar".

Figure 2:
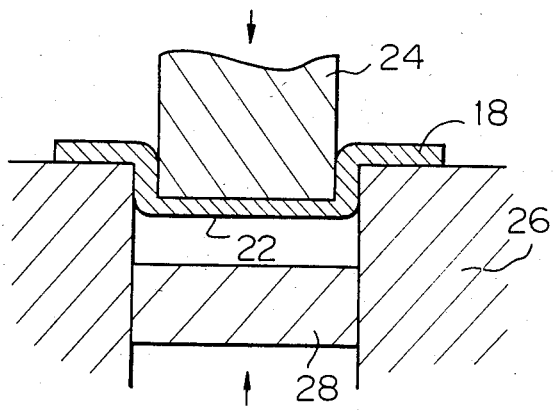
FIG. 2 is a sectional view of a metal cap as depressed in a conventional pressing step.

The metal cap 18 is produced by pressing a flat metal plate between a male die 24 and a female die 26 having preferably a movable central portion 28, as shown in FIG. 2. The metal cap 18 is seam-welded with the sealing metal frame 20, which is bonded on the ceramic layer of the ceramic lead base 14, by bringing electrodes 40 into contact at opposite peripheral edge of flat portions of the metal cap 18.

The conventional central depressed portion 22 of the metal cap 18 has a flat bottom surface. Consequently, mechanical stress due to the pressing is concentrated at the angles 30 (FIG. 3) at the periphery of the central depressed portion 22. As a result, the flat bottom surface of the central depressed portion 22 tends to bend in order to compensate for the residual stress.

Figure 3:
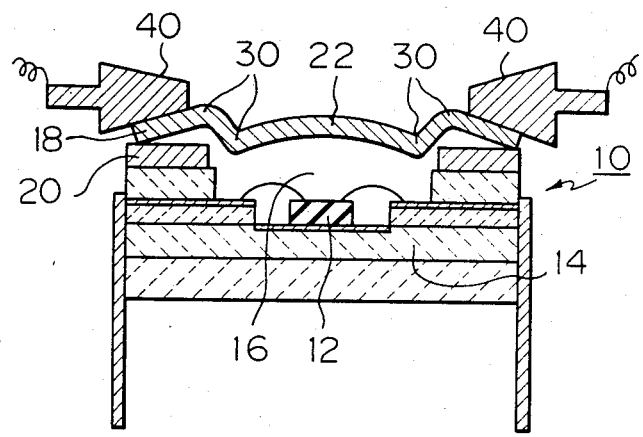
FIG. 3 is a sectional view of a conventional ceramic-type semiconductor package as welded in a sealing step.

When the metal cap 18 is seam-welded to the sealing metal frame 20, it is desirable for electrodes 40 to contact only the edge of the periphery of the metal cap 18 so as to generate sufficient heat for the seam-welding. If the metal cap 18 is bent, the electrodes 40 contact the peripheral flat portions of the metal cap 18 over in a broad area, as shown in FIG. 3, which leads to insufficient generation of heat and thus substandard seam-welding. Furthermore, the flat portion of the metal cap contacts the sealing metal frame 20 on the ceramic layer only at a small area, so that insufficient seam-welding is obtained.

An embodiment of the present invention will now be explained. Elements similar to those in the previous figures are indicated by the same reference numerals.

Figure 4:
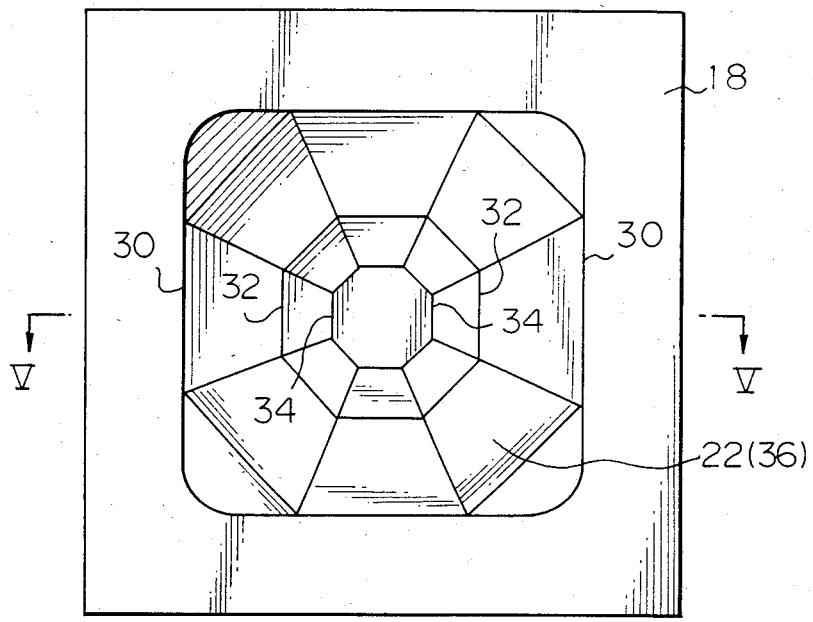
FIG. 4 is a bottom view of facted bottom surface of the central depressed portion of a metal cap according to the present invention.

As shown in FIG. 4, the central depressed portion 22 of the metal cap 18 according to the present invention has a central bottom wall, a sectional line of which is 30-32-34-34-32-30, with a faceted bottom surface 36. The faceted bottom surface 36 features many small planes delineated by facet lines 32 and 34. While FIG. 4 shows 21 planes, there is no specific limitation to the same. Also, while the lines are sharp, straight lines in FIGS. 4 and 5, they may also be curved lines.

The central bottom wall with the faceted bottom surface 36 sharply reduces the bending of the metal cap. It is believed that the increased number of angular portions due to the facets distributes the stress over a wider area.

Figure 5:
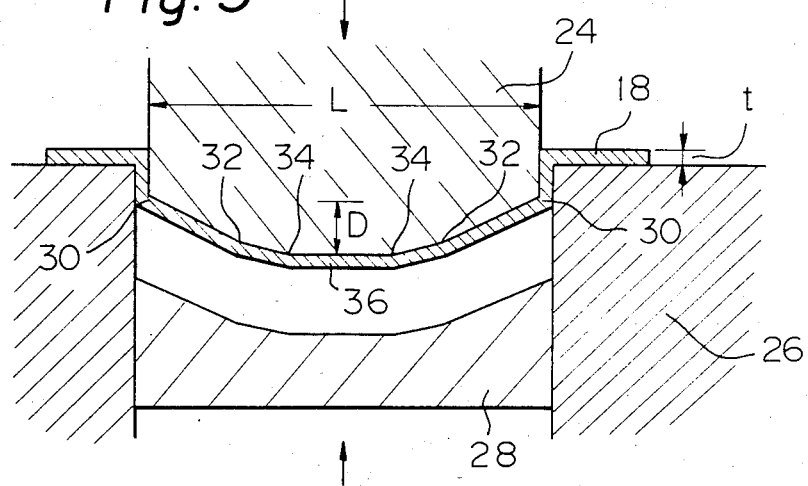
FIG. 5 is a sectional view of a metal cap as depressed in a pressing step according to the present invention.

Such a faceted bottom surface 36 is produced by pressing a flat metal plate of a 42 nickel-iron alloy or a nickel-cobalt-iron alloy sold under the tradename "Kovar" between faceted surfaces of a male die 24 and a movable portion 28 of a female die 26, as shown in FIG. 5. The thickness t of the flat metal plate is about 0.1 to 0.2 mm. The length L of the central saucer-like portion 30 of the metal cap 18 is about 18 mm, and the depth D of that saucer-like portion 30 is about 1 to 3 mm.

A sealing metal frame 20 of Kovar is bonded on the ceramic lead base 14 and plated with gold.

The central depressed portion of the metal cap 18 is inserted into the cavity 16 of the ceramic lead base 14. As there is little bending, the flat peripheral portions of the metal cap 18 rest intimately on the sealing metal frame 20 without any gap. The electrodes 40 contact only the edge of the flat peripheral portion of the metal cap 18 at a very narrow contact area. Thus, sufficient heat can be generated for seam-welding between the metal cap 18 and the metal sealing frame 20. Furthermore, the flat portion 18 of the metal cap contacts the sealing metal frame 20 over the entire surface thereof. Therefore, the seam-welding is sufficient.

The ceramic-type semiconductor package according to the present invention features reduced residual stress due to pressing and thus eliminates the tendency to bend, thereby improves the reliability of seam-welding of the metal cap with the sealing metal frame bonded on the ceramic lead base.

I claim:

1. A ceramic-type semiconductor package comprising:
   a semiconductor pellet;
   a ceramic lead base having a cavity for accommodating said pellet; and
   a metal cap for sealing said cavity, said cavity being upward opened and said metal cap having a central depressed portion to be inserted into said cavity, said central depressed portion having a bottom wall portion which has a plurality of facets.

2. A ceramic-type semiconductor package as set forth in claim 1, wherein said plurality of facets comprises a plurality of non-perpendicular adjacent surfaces.

3. A ceramic-type semiconductor package as set forth in claim 2, wherein said plurality of surfaces comprise at least three planar surfaces.

4. A process for producing a ceramic-type semiconductor package comprising the steps of:
   providing a semiconductor pellet;
   providing a ceramic lead base having an upward opened cavity for accommodating said semiconductor pellet;
   placing said semiconductor pellet in said cavity of said ceramic lead base;
   pressing a flat metal plate between a male die and a female die, said male die having a bottom surface comprising a plurality of facets, whereby a metal cap having a peripheral flat portion and a central depressed portion is produced, said central depressed portion having a bottom wall which has a plurality of facets;
   inserting said central depressed portion of said metal cap into said cavity of said ceramic lead base; and
   sealing the peripheral flat portion of said metal cap with a sealing metal frame bonded on said ceramic lead base.

5. A process according to claim 2, wherein said female die has a bottom wall comprising a plurality of facets.

6. A process for producing a ceramic-type semiconductor package as set forth in claim 4, wherein said plurality of facets comprise a plurality of non-perpendicular adjacent surfaces.

7. A process for producing a ceramic-type semiconductor package as set forth in claim 6, wherein said plurality of surfaces comprise at least three planar surfaces.

* * * * *